(12) United States Patent
Shimane et al.

(10) Patent No.: US 6,384,552 B2
(45) Date of Patent: May 7, 2002

(54) CONTROL APPARATUS FOR ELECTRIC VEHICLE

(75) Inventors: Iwao Shimane; Satoru Adachi; Hiroaki Takanohashi, all of Wako (JP)

(73) Assignee: Honda Giken Kogyo Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/729,702

(22) Filed: Dec. 6, 2000

(30) Foreign Application Priority Data

Dec. 7, 1999 (JP) .............................................. 11-348189

(51) Int. Cl.[7] .............................. H02P 5/41; B60L 11/00
(52) U.S. Cl. ....................... 318/139; 318/471; 318/722; 318/801
(58) Field of Search ................................. 318/138, 139, 318/254, 439, 471, 472, 619, 720, 721, 722, 800, 801; 363/74, 78, 95, 97, 98

(56) References Cited

U.S. PATENT DOCUMENTS

| | | | | |
|---|---|---|---|---|
| 3,693,067 A | * | 9/1972 | Walsh | 318/609 |
| 3,941,198 A | * | 3/1976 | Kappas | 180/11 |
| RE29,695 E | * | 7/1978 | Blake | 310/87 X |
| 4,152,569 A | * | 5/1979 | Bell, Jr. et al. | 318/624 X |
| 4,804,902 A | * | 2/1989 | Maier | 318/798 |
| 5,216,345 A | * | 6/1993 | Eyerly | 318/685 |
| 6,307,338 B1 | * | 10/2001 | Kuner et al. | 318/254 |

* cited by examiner

*Primary Examiner*—Bentsu Ro
(74) *Attorney, Agent, or Firm*—Arent Fox Kintner Plotkin & Kahn, PLLC (57) ABSTRACT

The present invention provides a control apparatus for an electric vehicle, capable of reducing the switching loss while restricting the surge voltage generated in the IGBT elements constituting a driving inverter of a motor for moving the electric vehicle to a predetermined voltage below an allowable surge withstand voltage. The control device of the electric vehicle comprises an IGBT temperature detecting device 11 for detecting the temperature of the IGBT elements, a gate resistance calculation device for detecting the resistance of the gate resistor so as to restrict the voltage including the surge voltage, which is applied to the elements, to a predetermined voltage below the allowable surge withstand voltage of the elements using an output command current, a battery voltage, and/or the detected temperature by the IGBT temperature detecting device 11 as parameters.

4 Claims, 7 Drawing Sheets

CONTROL APPARATUS FOR ELECTRIC VEHICLE

BACKGROUND OF THE INVENTION

1. Field of the Invention

The present invention relates to an inverter for a motor for driving an electric vehicle, and particularly relates to an input resistance control system of power elements (such as IGBT (Isolated Gate Bipolar Transistors)) for the purpose of reducing switching loss of the electric power elements.

2. Background Art

In general, a motor (e.g. a synchronous motor) composed of a rotor having a plurality of pairs of poles and a stator constituted by a three-phase winding is used for driving, electric vehicles and a predetermined driving force is obtained by supplying an alternating current power generated by an inverter based on a predetermined command current to the three-phase winding of a stator.

Figure 10:
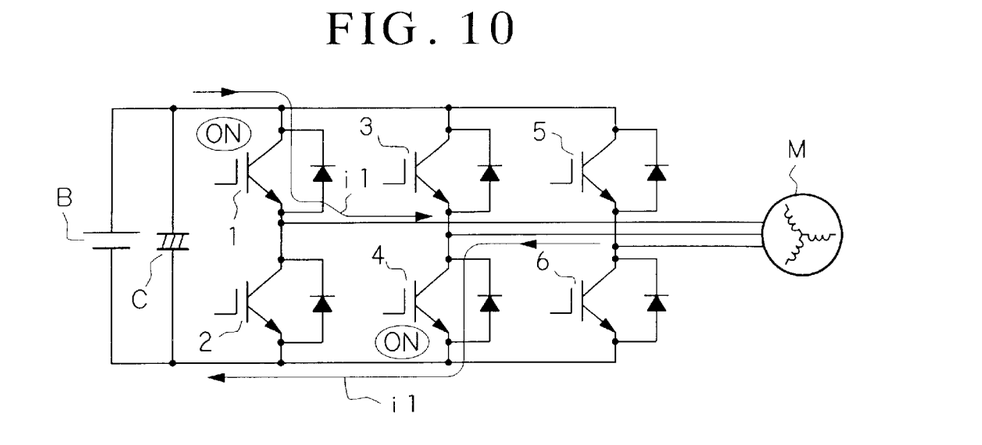
FIG. 10 is a diagram showing the current path when the three-phase bridge inverter using IGBT elements is in the current conducting state.

The above-described inverter is formed, as shown in FIG. 10, by connecting, using a three arm bridge, six power elements (such as IGBT elements, insulating gates, and bipolar transistors, and hereinafter, the power elements are assumed to be IGBT elements), and the alternating current power for driving the motor is obtained from the direct current source connected to current carrying devices by controlling the current carrying devices by gate controlling and switching these power elements.

Inputting a predetermined driving pulse to the gate of the IGBT elements carries out switching of IGBT elements.

Figure 11:
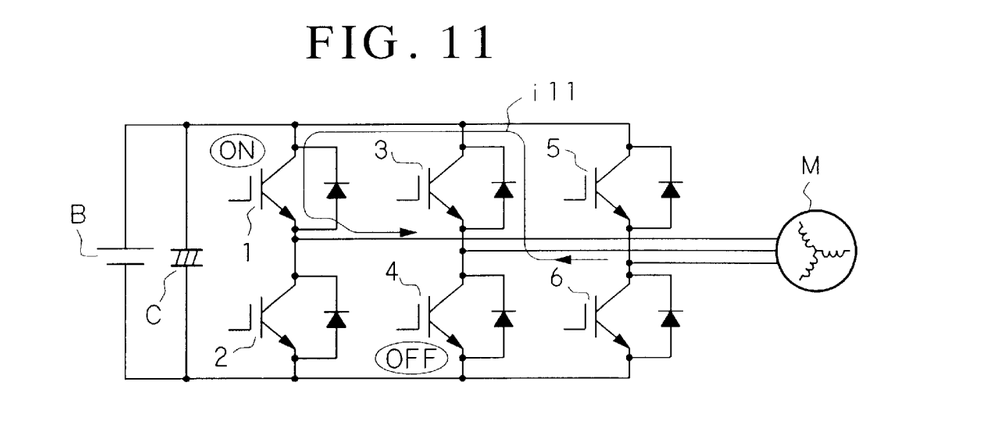
FIG. 11 is a diagram showing the motor current path when the IGBT elements in the current conducting state shown in FIG. 10 are turned OFF in sequence to a predetermined time difference.

There are two methods for driving the gate. The first method is to turn OFF the IGBT element 4 while maintaining the IGBT element 1 ON, as shown in FIG. 11, in the case of stopping a current i1 which flows in the motor winding, as shown in FIG. 10, by supplying the current i1 through the positive side IGBT element 1 connected to one arm and the negative side IGBT element 4 connected to the other arm. At this time, the current flowing in the motor constituting an inductive load flows to the diode portion by passing the IGBT element 1 and IGBT element 3 through a current route i11, and the above IGBT element 1 is turned OFF after the current i11 has been attenuated.

Figure 12:
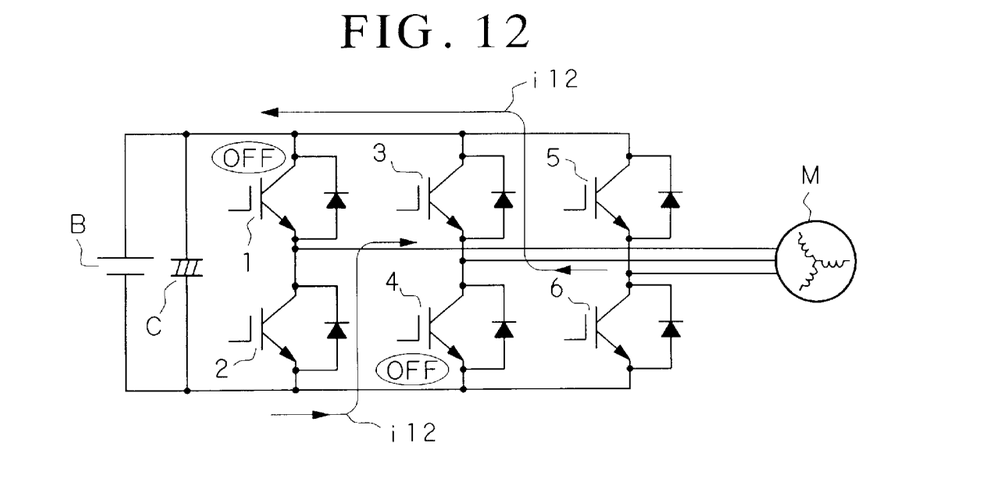
FIG. 12 is a diagram showing the motor current path when the IGBT elements in the current conducting state shown in FIG. 10 are turned OFF.

The second method for driving the gate is, as shown in FIG. 12, a driving method to turn OFF the IGBT element 1 and IGBT element 4 simultaneously. At this time, since the current i1, shown in FIG. 10, flowing in the motor M is fed back as a current i12 passing through the diode portion of the IGBT element 2 and the diode portion of the IGBT 3, the current i12 disappears within a comparatively short period of time.

However, when the gate is driven as described above, the switching speed is delayed by blunting the rise and fall of the signal voltage applied to the gate using a parasitic capacitance originated between the gate and emitter of the IGBT element and the input resistance, which is attached in series to the gate of the IGBT element, in order to prevent breakdown of the elements by a surge voltage.

When the switching speed is reduced, the problem arises that the delayed switching generates heat in the IGBT element due to the switching loss, and the generated heat causes thermal breakdown of the elements and, in contrast, requires a large cooling device. The problem also arises because the increase of the heat loss and the large cooling system consumes the electric power of the battery, which results in reducing the traveling distance of the vehicle.

SUMMARY OF THE INVENTION

It is therefore an object of the present invention to provide a control apparatus for electric vehicles, which is capable of reducing the switching loss while restricting the surge voltage to a safe withstand voltage below an allowable surge withstand voltage by controlling the resistance of an input resistance depending on the traveling state of the electric vehicle.

According to the first aspect of the present invention, a control apparatus for an electric vehicle is provided, which controls a traveling electric vehicle by supplying an electric power to a motor for driving the vehicle through an inverter comprising an input resistance value setting device for setting the resistance value of an input resistor to a plurality of electric power elements in said inverter in response to the driving state of the vehicle.

In the control apparatus for an electric vehicle according to the first aspect, the input resistance value setting device sets said resistance value in response to any one of said battery voltage, the temperature of said electric power elements, or the power consumption of said power elements.

DETAILED DESCRIPTION OF THE INVENTION

Hereinafter, the first embodiment of the present invention is described in detail with reference to the attached drawings. The first embodiment shows an example in which an IGBT element is used as the electric power element.

Figure 1:
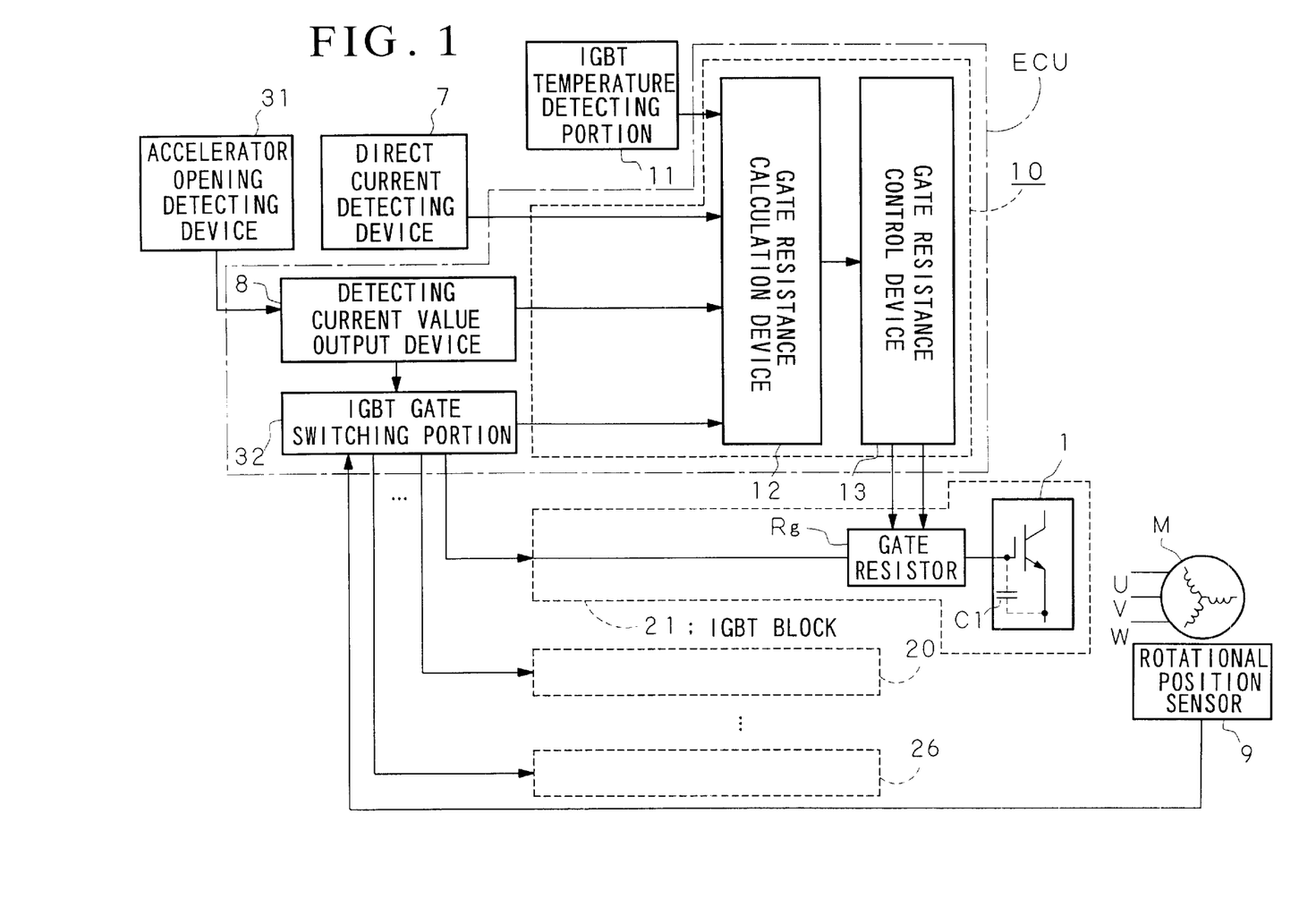
FIG. 1 is a block diagram showing the structure of an inverter controlling apparatus for controlling the motor having a gate resistance control portion for moving the electric vehicle according to the first embodiment of the present invention.

FIG. 1 is a block diagram showing the structure of an inverter controlling apparatus for controlling the motor having a gate resistance control portion for driving the electric vehicle according to the first embodiment of the present invention.

In FIG. 1, the symbol ECU represents the gate control device, which comprises a command current value output device 8 for outputting a command current value in response to an output of the accelerator opening detecting device 31, the IGBT gate switching portion 32, and a gate resistance control portion 10, both of which are controlled by the output of the command current value output device 8, and the gate resistor Rg of IGBT blocks 21 to 26 are controlled by the output of the gate resistance control portion 10.

The IGBT blocks 21 to 26 are connected to IGBTs 1 to 6 through a gate resistor Rg, and switching operations of the IGBTs 1 to 6 are executed when the control signal from the gate control device ECU is applied to the gate resistor Rg.

It is noted that, although FIG. 1 shows only one IGBT 1, practically six IGBTs 1–6 are provided for forming an inverter, similar to FIG. 10 and IGBTs 2 to 6 are omitted.

Below, the operations of the gate resistance control portion 10 and the IGBT block 21 are described.

The gate resistance control portion 10 comprises a gate resistance calculation device 12 and a gate resistance control portion 13.

The gate resistance calculation device 12 receives a control signal from the IGBT temperature detection device 11, a detection signal from a direct current voltage detection device 7, control signals from the command current value output device 18 and IGBT gate switching portion 32, and the minimum value of the gate resistance, which can be set, is calculated depending upon the correlation between the gate resistance and the environmental conditions, which are described later.

The result of the calculation executed by the gate resistance calculation device 12 is delivered to the gate resistance control portion 13, and the sharpness of the rise and fall of the signal voltage applied to the gate of the IGBT 1 is controlled by the overall effect between the gate resistance obtained by switching the resistor Rg and the stray capacitance of the gate and emitter of the IGBT 1.

Figure 2:
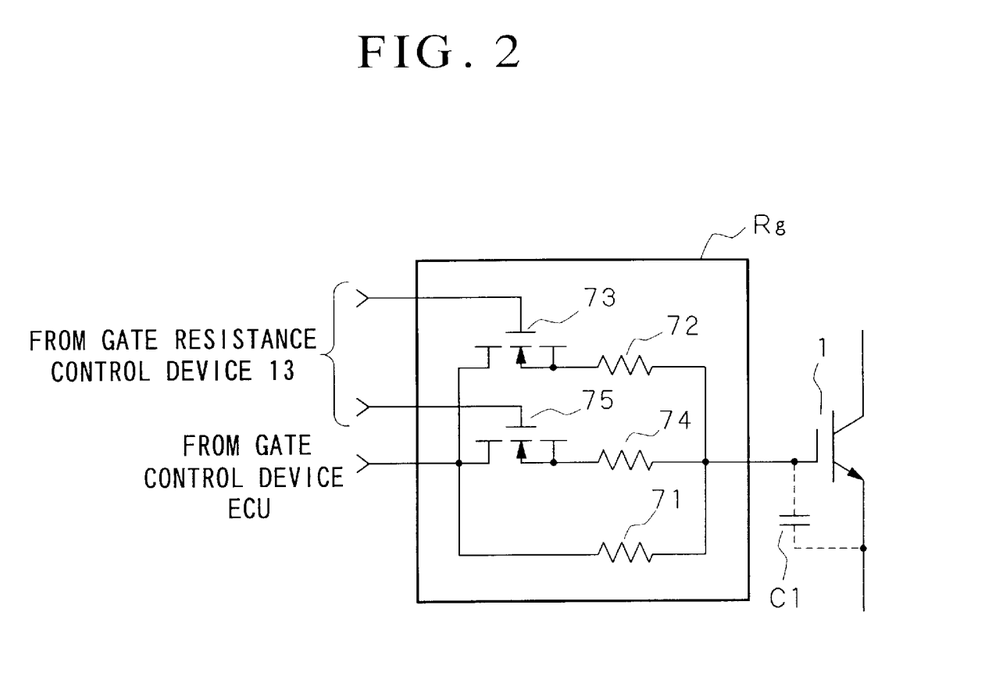
FIG. 2 is a diagram showing the structure of the gate resistance of a IGBT.

FIG. 2 is a diagram showing the structure of the gate resistor Rg. The switching operation of the gate resistor Rg is explained with reference to FIG. 2.

The gate resistor Rg comprises a resistor 71 and two other resistors 72 and 74, which are selectively connected in parallel with the resistor 71, and two transistors 73 and 75 for connecting or disconnecting the resistors 72 and 74, respectively.

A signal from the gate resistance control device 13 activates the transistors 73 and/or 75 for connecting in parallel or disconnecting the resistor 72 and/or 74 to the resistor 71.

Figure 3:
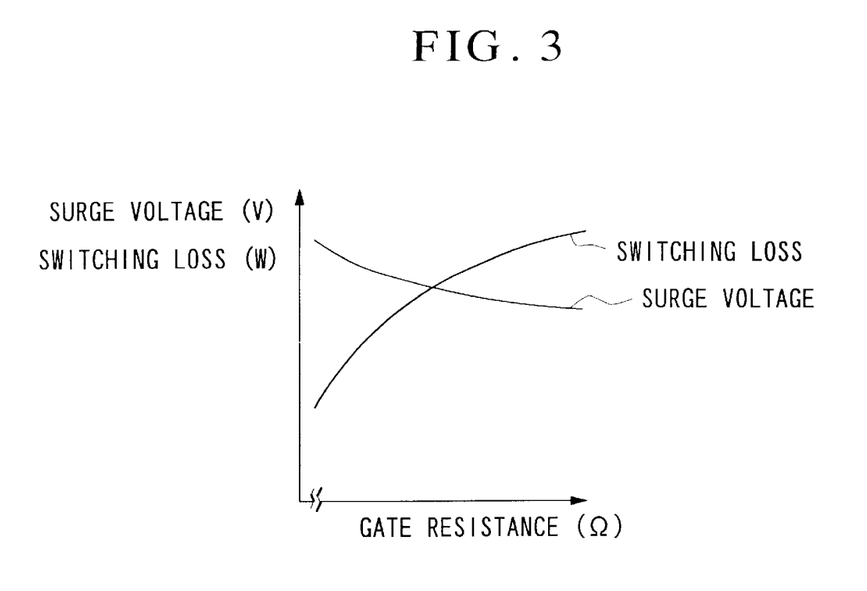
FIG. 3 is a diagram showing the relationship between the gate resistance, the surge voltage, and the switching loss.

Next, the relationship between the resistance of the gate resistor Rg of the IGBT and the surge voltage or the switching loss is described with reference to FIG. 3. As seen in FIG. 3, the switching loss decreases as the resistance of the gate resistor decreases, but the surge voltage increases. In contrast, when the resistance of the gate resistor increases, the surge voltage increases but the switching loss increases.

This is because the sharpness of the rise and fall of the signal voltage applied to the gate decreases by the effect of the parasitic capacitance between the gate and the emitter of the IGBT when the resistance of the gate resistor is large.

If the rise and fall of the signal voltage applied to the gate of the IGBT are sharp, the value of the derivative (di/dt) becomes large, and the surge voltage $L \cdot (di/dt)$, which is generated by the stray inductance L of the wiring bus bar, also becomes large.

In contrast, when the rise and fall of the signal voltage applied to the gate of the IGBT is not sharp, although the value of the surge voltage $L \cdot (di/dt)$ becomes small, the time required for switching becomes long, and the switching loss increases because of the timing for the flow of the current in the state that the IGBT is not saturated.

Figure 4:
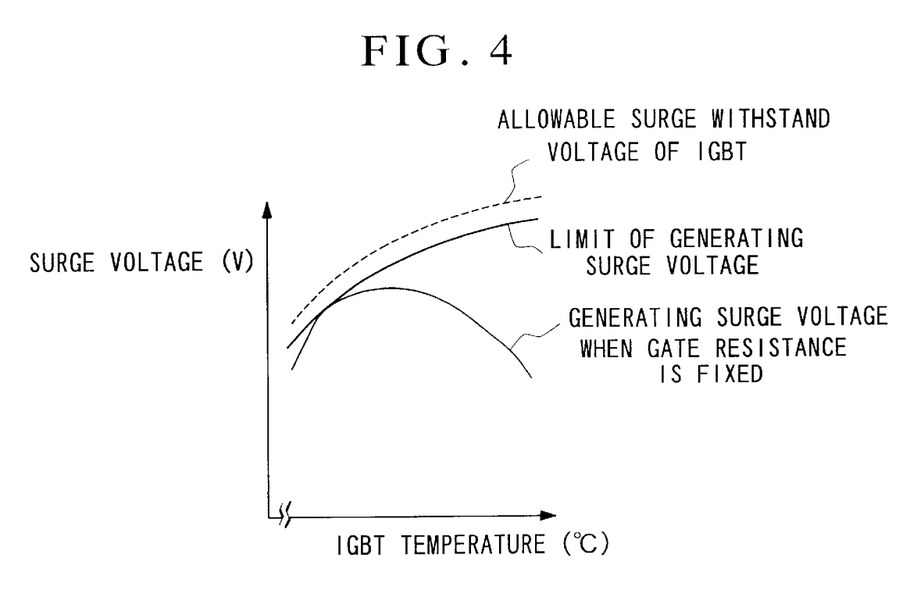
FIG. 4 is a diagram explaining the relationship between the IGBT temperature and the surge voltage.

FIG. 4 is a diagram showing the relationship between the temperature of the IGBT and the surge voltage. The uppermost line shows the allowable surge withstand voltage of the IGBT, which indicates that the allowable surge withstand voltage increases as the temperature of the IGBT increases.

On the other hand, as shown by the lowermost line of FIG. 4, when the resistance of the gate resistor is fixed, the generating surge voltage increases with the increase of the temperature of the IGBT in the low temperature region. However, in the high temperature region, the generated surge voltage decreases with the increase of the temperature.

As shown in FIG. 4, in the high temperature region, a considerable discrepancy hereinafter called a margin voltage) is present between the allowable surge withstand voltage of the IGBT and the generated surge voltage, thus, if the resistance of the gate resistor is maintained at a low value, the rise and fall of the signal voltage to be applied to the gate become sharp. Accordingly, it is possible to reduce the switching loss by permitting the generation of a high surge voltage up to the level of the allowable surge withstand voltage.

Figure 5:
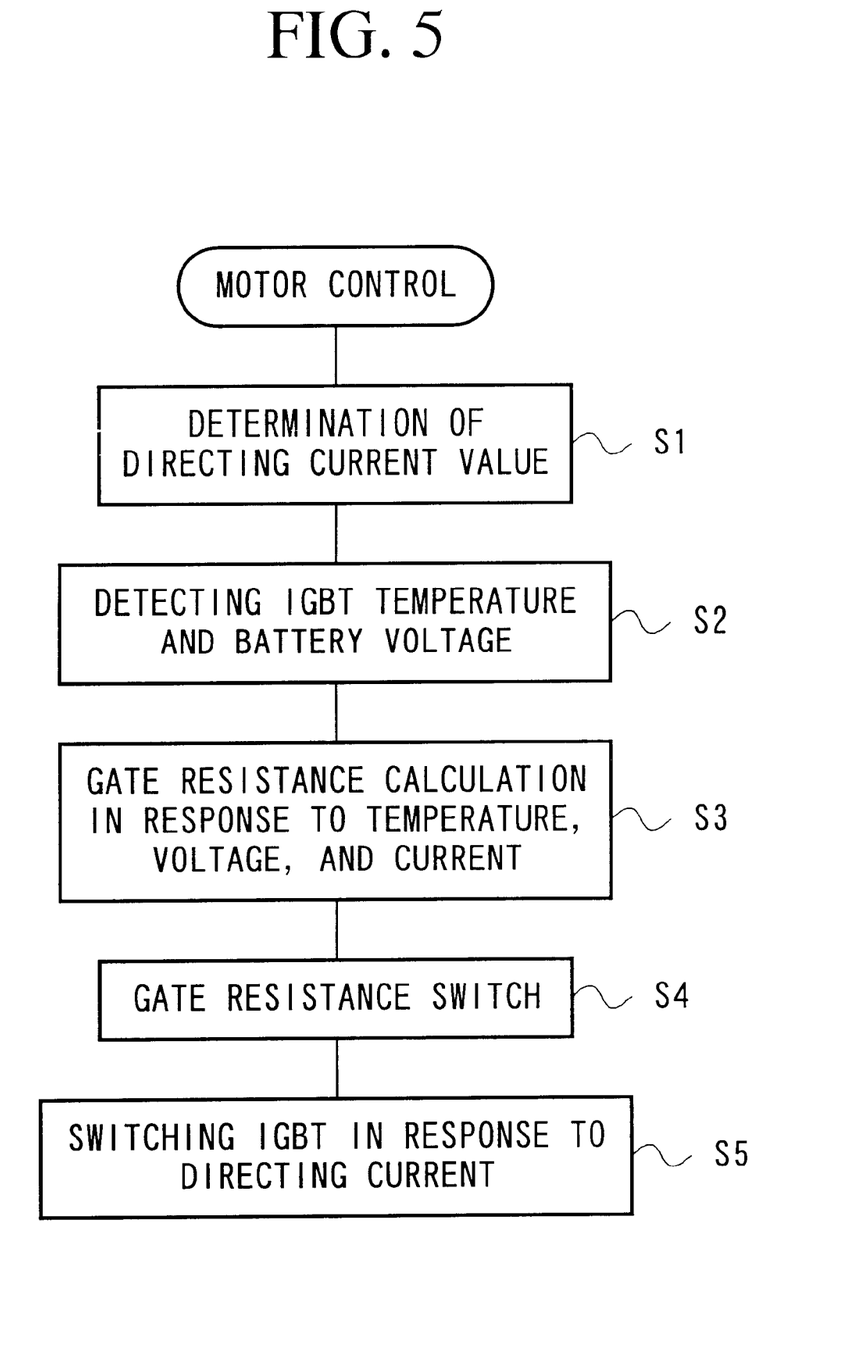
FIG. 5 is a flow-chart showing a procedure for the motor control using the control apparatus of the electric vehicle according to the first embodiment of the present invention.

FIG. 5 is a flow-chart showing a process for controlling a motor. In FIG. 5, the command current value is determined in step S1 and the signal is generated from the command current value output device 8.

In step S2, an IGBT element temperature-detecting device 11 detects the temperature of the IGBT and the battery voltage is detected by a direct current voltage detecting device 7.

In step S3, an optimum gate resistance is calculated in a gate resistance calculation device 12 in response to the temperature, the voltage, and the current obtained in step S1 and S2.

In step S4, the gate resistor Rg is switched by a gate resistance control device 13. This switching is executed in order to switch the gate resistor Rg into a resistance, which is larger than and close to the above-described optimum gate resistance.

In step S5, the IGBT gate control device ECU drives the motor by switching the IGBTs in response to the command current.

Next, the technical basis for calculating the gate resistance is described below with reference to FIGS. 6 to 8.

Figure 6:
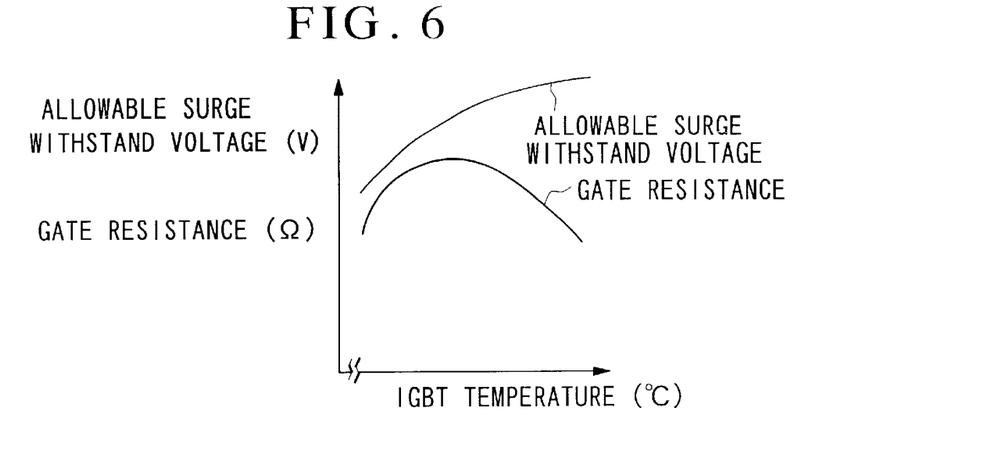
FIG. 6 is a diagram showing the relationship between the IGBT temperature, a desirable gate resistance, and the allowable surge withstand voltage.

FIG. 6 is a diagram showing the relationship between the temperature of the IGBT and the allowable surge withstand voltage and the relationship between the temperature of the IGBT element and the gate resistance, that restricts the generation of a surge voltage at a predetermined voltage below the allowable surge withstand voltage.

As shown in FIG. 6, the switching loss can be minimized by increasing the resistance of the gate resistor with the increase of the temperature in a region where the temperature is comparatively low, and by reducing the resistance of the gate resistor with the increase of the temperature in the high temperature region. Here, the margin voltage is defined by the difference between the above-described allowable surge withstand voltage and the above-described predetermined voltage.

Figure 7:
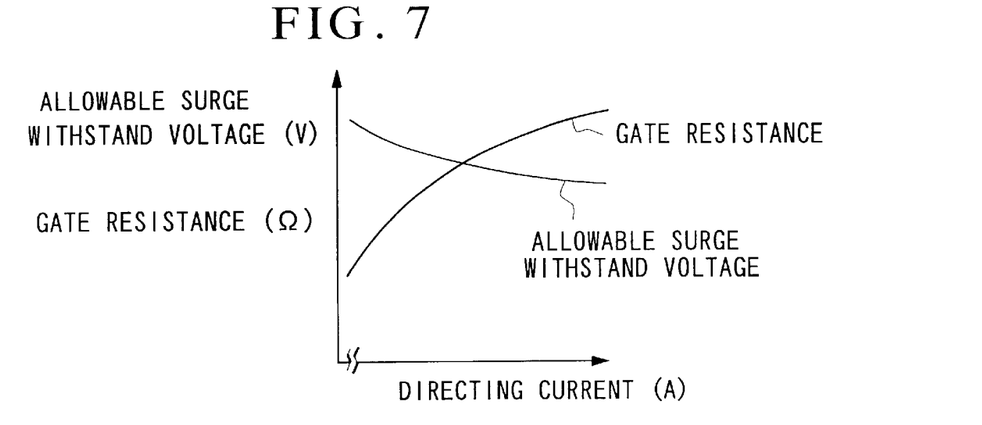
FIG. 7 is a diagram showing the relationship between the command current, the desirable gate resistance, and the allowable surge withstand voltage.

FIG. 7 is a diagram showing the relationship between the command current value and the allowable surge withstand voltage and the relationship between the command current value and the gate resistance, that restricts the generating surge voltage to a predetermined value below the allowable surge withstand voltage.

As shown in FIG. 7, since the allowable surge withstand voltage tends to decrease with the increase of the command current value, it is necessary to increase the resistance of the gate resistor with the increase of the command current value, in order to restrict the generating surge voltage to a predetermined voltage below the allowable surge withstand voltage. Here, the margin voltage is defined by the difference between the above-described allowable surge withstand voltage and the above-described predetermined voltage.

Figure 8:
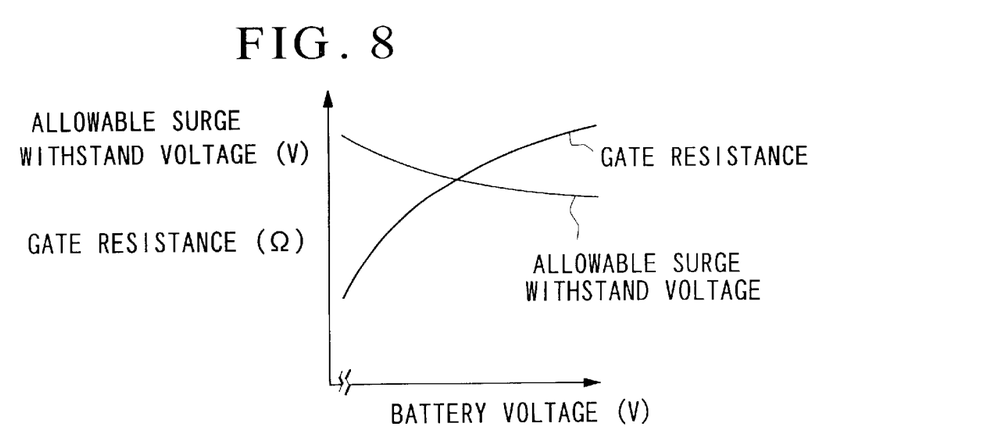
FIG. 8 is a diagram showing the relationship between the battery voltage, the desirable gate resistance, and the allowable surge withstand voltage.

FIG. 8 is a diagram showing the relationship between the battery voltage and the allowable surge withstand voltage and the relationship between the battery voltage and the gate resistance that restricts the generating surge voltage to a predetermined voltage below the allowable surge withstand voltage.

As shown in FIG. 8, since the allowable surge withstand voltage tends to decrease with the increase of the battery voltage, it is necessary to increase the gate resistance of the gate resistor with the increase of the battery voltage in order to restrict the generating surge voltage to a predetermined voltage below the allowable surge withstand voltage. Here, the margin voltage is defined by the difference between the above-described allowable surge withstand voltage and the above-described predetermined voltage.

Accordingly, when the resistance of the gate resistor Rg is controlled to a minimum value that satisfies all of the environmental conditions by the gate resistance calculation device 12, the generating surge voltage can be restricted to a predetermined value below the allowable surge withstand voltage and the switching loss can be minimized.

Next, the second embodiment of the present invention is explained below.

Figure 9:
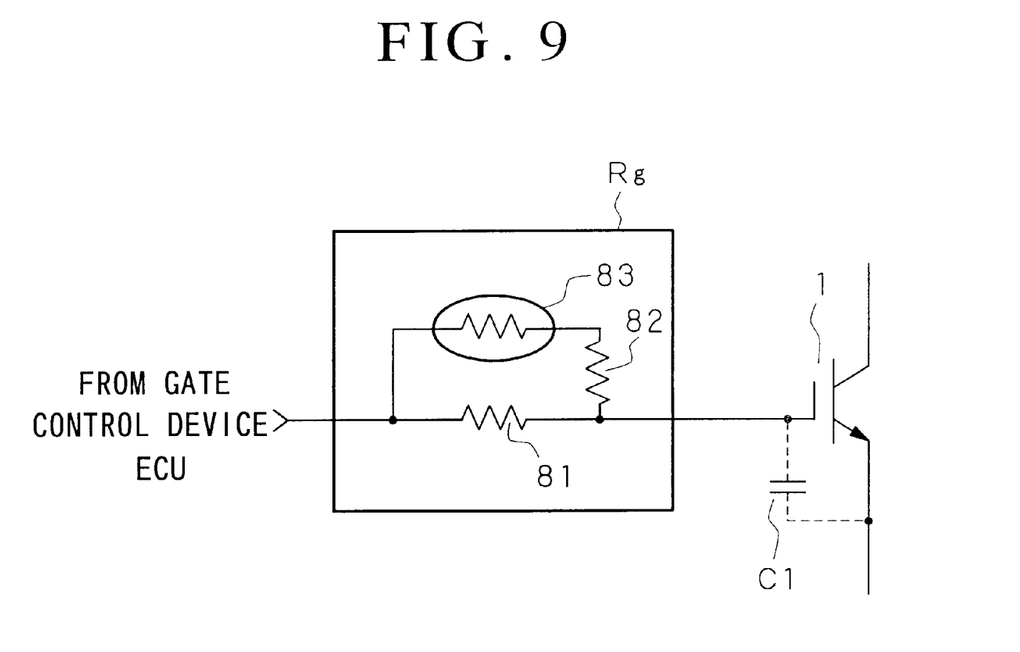
FIG. 9 is a diagram explaining the gate resistance control of the IGBT according to the second embodiment of the present invention.

FIG. 9 is a diagram explaining the gate resistance control of the IGBT elements according to the second embodiment of the present invention. As shown in FIG. 9, the gate resistor Rg is formed by connecting in parallel a fixed resistor 81 and a component, formed by connecting a fixed resistor 82 and a thermistor 83 in series, and a control signal for the gate control device ECU is applied to the gate of the IGBT element through the gate resistor Rg.

It is noted, however, that the second embodiment neither includes the gate resistance calculation device nor the gate resistance control device, since the resistance of the gate resistor changes depending on the temperature of the IGBT element, and is not controlled by a computer in this embodiment.

The resistance of the thermistor 82 has a large negative temperature coefficient, so that the composite resistance of the above gate resistor Rg decreases with the increase of the temperature of the IGBT.

Accordingly, the switching loss can be reduced by selecting appropriate elements for constituting the gate resistor such that the generating surge voltage is restricted to a predetermined value below the allowable surge withstand voltage.

The operation of the preferred embodiments of the present invention has been described with reference to the attached drawings, but the variants thereof can be envisaged which do not exceed the scope of the present invention.

For example, the IGBT element has been described as an example of the electric power element, but other elements such as FETs or bipolar transistors may be used for the electric power elements.

Furthermore, in the above embodiments, although an example is shown in which the gate resistance control is carried out in common for the gate resistor comprising a plurality of IGBT elements, it is possible to provide a gate resistance control device for each IGBT element.

It is also noted that the number of the resistors connected in parallel for forming the gate resistor is not limited to the above embodiments.

The gate resistor can be formed by connecting resistors in series.

Furthermore, the resistor having a high temperature coefficient is not limited to a thermistor and other elements can be used for forming the gate resistor.

As described above, the present invention has the effect that since the present control apparatus for electric vehicles controls the resistance of the input resistor to be as low as possible so as to restrict the generating surge voltage to a predetermined value below the allowable surge withstand voltage, the switching loss can be reduced to a minimum while the generating surge voltage is restricted to within a safe region.

What is claimed is:

1. A control apparatus for a vehicle including an electric vehicle and a hybrid vehicle, provided with a motor for driving the vehicle, a storage device for supplying DC electric power, and an inverter composed of a plurality of power elements for converting the DC electric power of said battery into AC electric power to supply it to said motor while driving said motor, wherein the control apparatus of said electric vehicle comprises:

an input resistance value setting device for setting resistance values of input resistors to a plurality of power elements in said inverter in response to the driving state of the vehicle.

2. A control apparatus for a vehicle according to claim 1, wherein the input resistance value setting device sets said resistance values of said power elements in response to the voltage of said storing device.

3. A control apparatus for a vehicle according to claim 1, wherein the input resistance value setting device sets said resistance values in response to the temperature of said power elements.

4. A control apparatus for a vehicle according to claim 1, wherein the input resistance value setting device sets said resistance values in response to the power consumption of said power elements.

* * * * *